(12) United States Patent
Hartman et al.

(10) Patent No.: US 9,560,720 B2
(45) Date of Patent: Jan. 31, 2017

(54) EMERGENCY VEHICLE ALERT SYSTEM

(71) Applicant: GENERAL ELECTRIC COMPANY, Schenectady, NY (US)

(72) Inventors: Michael James Hartman, Clifton Park, NY (US); Bruce Gordon Barnett, Niskayuna, NY (US); John Erik Hershey, Ballston, NY (US); Michael Joseph Dell'Anno, Niskayuna, NY (US); Stanislava Soro, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/546,982

(22) Filed: Nov. 18, 2014

(65) Prior Publication Data

US 2015/0138000 A1    May 21, 2015

Related U.S. Application Data

(60) Provisional application No. 61/907,090, filed on Nov. 21, 2013, provisional application No. 61/907,078, (Continued)

(51) Int. Cl.
*G08G 1/07* (2006.01)
*H05B 37/02* (2006.01)
(Continued)

(52) U.S. Cl.
CPC .......... *H05B 37/0227* (2013.01); *G01P 15/18* (2013.01); *G01R 22/06* (2013.01); *G08B 21/18* (2013.01);
(Continued)

(58) Field of Classification Search
CPC .......... G08G 1/087; G08G 1/01; G08G 1/095; G08G 1/017; G08G 1/07; G08G 1/096716; G08G 1/096741; G08G 1/09675; G08G 1/096775; G08G 1/096783; G08G 1/205; G08G 1/00; G08G 1/0965; G08G 1/08
(Continued)

(56) References Cited

U.S. PATENT DOCUMENTS

| 4,704,610 A | 11/1987 | Smith et al. |
| 4,878,754 A | 11/1989 | Homma et al. |

(Continued)

FOREIGN PATENT DOCUMENTS

| EP | 1437270 A1 | 7/2004 |
| EP | 2131630 A2 | 12/2009 |

(Continued)

OTHER PUBLICATIONS

Atlas, "Optical Extinction by Rainfall", Journal of Meteorology, vol. No. 10, pp. 486-488, Dec. 1953.

(Continued)

*Primary Examiner* — Daniel Previl
(74) *Attorney, Agent, or Firm* — Pabitra K. Chakrabarti (57) ABSTRACT

A method and system for the control and signaling of traffic signal lights by emergency vehicles in the vicinity. Emergency vehicles can be detected by traffic signal lights allowing the emergency vehicle to have a prioritized, rapid, unimpeded, and safe emergency vehicle transit.

18 Claims, 5 Drawing Sheets

Related U.S. Application Data filed on Nov. 21, 2013, provisional application No. 61/907,069, filed on Nov. 21, 2013, provisional application No. 61/907,114, filed on Nov. 21, 2013, provisional application No. 61/907,133, filed on Nov. 21, 2013, provisional application No. 61/907,150, filed on Nov. 21, 2013, provisional application No. 61/907,168, filed on Nov. 21, 2013, provisional application No. 61/907,188, filed on Nov. 21, 2013, provisional application No. 61/907,210, filed on Nov. 21, 2013.

(51) Int. Cl.
| | |
|---|---|
| *G08G 1/087* | (2006.01) |
| *H04W 4/04* | (2009.01) |
| *G01R 22/06* | (2006.01) |
| *G01P 15/18* | (2013.01) |
| *G08B 21/18* | (2006.01) |

(52) U.S. Cl.
CPC ............ *G08G 1/087* (2013.01); *H04W 4/046* (2013.01); *H05B 37/0263* (2013.01); *H05B 37/0272* (2013.01); *Y02B 20/72* (2013.01)

(58) Field of Classification Search
USPC ................ 340/906, 907, 901–904, 909–911, 917,340/931, 978, 995.13, 326–332
See application file for complete search history.

(56) References Cited

U.S. PATENT DOCUMENTS

| | | | |
|---|---|---|---|
| 5,014,052 A | 5/1991 | Obeck | |
| 5,028,129 A | 7/1991 | Smith | |
| 5,199,044 A | 3/1993 | Takeuchi et al. | |
| 5,243,185 A | 9/1993 | Blackwood | |
| 5,345,232 A | 9/1994 | Robertson | |
| 5,519,692 A | 5/1996 | Hershey et al. | |
| 5,519,725 A | 5/1996 | Hershey et al. | |
| 5,526,357 A | 6/1996 | Jandrell | |
| 5,557,261 A | 9/1996 | Barbour | |
| 5,563,728 A | 10/1996 | Allen et al. | |
| 5,563,906 A | 10/1996 | Hershey et al. | |
| 5,568,507 A | 10/1996 | Hershey et al. | |
| 5,568,508 A | 10/1996 | Hershey | |
| 5,568,509 A | 10/1996 | Hershey et al. | |
| 5,568,522 A | 10/1996 | Hershey et al. | |
| 5,682,100 A | 10/1997 | Rossi et al. | |
| 5,761,238 A | 6/1998 | Ross et al. | |
| 5,822,099 A | 10/1998 | Takamatsu | |
| 5,844,949 A | 12/1998 | Hershey et al. | |
| 5,852,243 A | 12/1998 | Chang et al. | |
| 5,903,594 A | 5/1999 | Saulnier et al. | |
| 6,011,508 A | 1/2000 | Perreault et al. | |
| 6,101,214 A | 8/2000 | Hershey et al. | |
| 6,122,084 A | 9/2000 | Britz et al. | |
| 6,288,632 B1 | 9/2001 | Hoctor et al. | |
| 6,308,134 B1 | 10/2001 | Croyle et al. | |
| 6,346,875 B1 | 2/2002 | Puckette et al. | |
| 6,424,250 B1 | 7/2002 | Puckette, IV et al. | |
| 6,430,210 B1 | 8/2002 | McGrath et al. | |
| 6,433,976 B1 | 8/2002 | Phillips | |
| 6,459,998 B1 | 10/2002 | Hoffman | |
| 6,504,634 B1 | 1/2003 | Chan et al. | |
| 6,522,243 B1 | 2/2003 | Saulnier et al. | |
| 6,659,715 B2 | 12/2003 | Kuesters et al. | |
| 6,693,556 B1* | 2/2004 | Jones ................ G08G 1/095 340/815.45 | |
| 6,717,660 B1 | 4/2004 | Bernardo | |
| 6,943,668 B2 | 9/2005 | Gaus, Jr. et al. | |
| 7,175,082 B2 | 2/2007 | Hoshina | |
| 7,248,149 B2 | 7/2007 | Bachelder et al. | |
| 7,294,977 B1 | 11/2007 | Eusterbrock et al. | |
| 7,418,346 B2 | 8/2008 | Breed et al. | |
| 7,460,787 B2 | 12/2008 | Damink et al. | |
| 7,580,705 B2 | 8/2009 | Kumar | |
| 7,629,899 B2 | 12/2009 | Breed | |
| 7,646,330 B2 | 1/2010 | Karr | |
| 7,817,063 B2 | 10/2010 | Hawkins et al. | |
| 7,834,555 B2 | 11/2010 | Cleland et al. | |
| 7,855,376 B2 | 12/2010 | Cantin et al. | |
| 7,876,864 B2 | 1/2011 | Conrad et al. | |
| 7,899,621 B2 | 3/2011 | Breed et al. | |
| 7,912,645 B2 | 3/2011 | Breed et al. | |
| 7,983,685 B2 | 7/2011 | Silverstrim et al. | |
| 7,983,836 B2 | 7/2011 | Breed | |
| 8,092,032 B2 | 1/2012 | Pearse | |
| 8,138,690 B2 | 3/2012 | Chemel et al. | |
| 8,140,276 B2 | 3/2012 | Walters et al. | |
| 8,227,995 B2 | 7/2012 | Damink et al. | |
| 8,232,745 B2 | 7/2012 | Chemel et al. | |
| 8,244,260 B2 | 8/2012 | Silverstrim et al. | |
| 8,260,537 B2 | 9/2012 | Breed | |
| 8,274,373 B2 | 9/2012 | Nysen | |
| 8,339,069 B2 | 12/2012 | Chemel et al. | |
| 8,368,321 B2 | 2/2013 | Chemel et al. | |
| 8,373,362 B2 | 2/2013 | Chemel et al. | |
| 8,384,312 B2 | 2/2013 | Tsai | |
| 8,436,748 B2 | 5/2013 | Mimeault et al. | |
| 8,441,214 B2 | 5/2013 | Anderson | |
| 8,442,403 B2 | 5/2013 | Weaver | |
| 8,442,785 B2 | 5/2013 | Walters et al. | |
| 8,456,325 B1 | 6/2013 | Sikora | |
| 8,475,002 B2 | 7/2013 | Maxik et al. | |
| 8,641,241 B2 | 2/2014 | Farmer | |
| 8,840,569 B2 | 9/2014 | Flaction et al. | |
| 8,842,009 B2 | 9/2014 | Jones | |
| 8,947,296 B2 | 2/2015 | Raz et al. | |
| 9,192,026 B2 | 11/2015 | Marquardt et al. | |
| 9,192,029 B2 | 11/2015 | Marquardt et al. | |
| 2002/0141882 A1 | 10/2002 | Ingistov et al. | |
| 2005/0017647 A1 | 1/2005 | Huang | |
| 2005/0047864 A1 | 3/2005 | Yamada et al. | |
| 2005/0104745 A1* | 5/2005 | Bachelder ................ F41G 9/00 340/906 | |
| 2005/0187701 A1* | 8/2005 | Baney ............. G08G 1/096716 701/117 | |
| 2007/0063875 A1 | 3/2007 | Hoffberg | |
| 2007/0201540 A1 | 8/2007 | Berkman | |
| 2007/0229250 A1 | 10/2007 | Recker et al. | |
| 2008/0037241 A1 | 2/2008 | Von Der Brelie | |
| 2008/0072766 A1 | 3/2008 | Kobylarz | |
| 2008/0122642 A1 | 5/2008 | Radtke et al. | |
| 2008/0150757 A1 | 6/2008 | Hutchison | |
| 2008/0238720 A1 | 10/2008 | Lee | |
| 2009/0002982 A1 | 1/2009 | Hu et al. | |
| 2009/0033504 A1 | 2/2009 | Tsai et al. | |
| 2009/0034258 A1* | 2/2009 | Tsai ....................... H05B 37/02 362/253 | |
| 2009/0066540 A1 | 3/2009 | Marinakis et al. | |
| 2009/0120299 A1 | 5/2009 | Rahn et al. | |
| 2009/0128328 A1 | 5/2009 | Fan | |
| 2009/0158739 A1 | 6/2009 | Messmer | |
| 2009/0164174 A1 | 6/2009 | Bears et al. | |
| 2009/0167508 A1 | 7/2009 | Fadell et al. | |
| 2009/0214198 A1 | 8/2009 | Takahashi et al. | |
| 2009/0268453 A1 | 10/2009 | Pearse | |
| 2009/0297156 A1 | 12/2009 | Nakagawa et al. | |
| 2010/0013608 A1 | 1/2010 | Petrisor et al. | |
| 2010/0029268 A1 | 2/2010 | Myer et al. | |
| 2010/0115093 A1 | 5/2010 | Rice | |
| 2010/0295473 A1 | 11/2010 | Chemel et al. | |
| 2010/0295474 A1 | 11/2010 | Chemel et al. | |
| 2010/0295475 A1 | 11/2010 | Chemel et al. | |
| 2010/0295482 A1 | 11/2010 | Chemel et al. | |
| 2010/0295943 A1 | 11/2010 | Cha et al. | |
| 2010/0296285 A1 | 11/2010 | Chemel et al. | |
| 2010/0301768 A1 | 12/2010 | Chemel et al. | |
| 2010/0301770 A1 | 12/2010 | Chemel et al. | |
| 2010/0301771 A1 | 12/2010 | Chemel et al. | |
| 2010/0301773 A1 | 12/2010 | Chemel et al. | |
| 2010/0301774 A1 | 12/2010 | Chemel et al. | |

(56) References Cited

U.S. PATENT DOCUMENTS

| | | |
|---|---|---|
| 2010/0301834 A1 | 12/2010 | Chemel et al. |
| 2010/0302779 A1 | 12/2010 | Chemel et al. |
| 2010/0308736 A1 | 12/2010 | Hung et al. |
| 2010/0309209 A1 | 12/2010 | Hodgins et al. |
| 2011/0001436 A1 | 1/2011 | Chemel et al. |
| 2011/0001438 A1 | 1/2011 | Chemel et al. |
| 2011/0001626 A1 | 1/2011 | Yip et al. |
| 2011/0043035 A1 | 2/2011 | Yamada et al. |
| 2011/0069960 A1 | 3/2011 | Knapp et al. |
| 2011/0095867 A1 | 4/2011 | Ahmad |
| 2011/0115384 A1 | 5/2011 | Chatelus |
| 2011/0140950 A1 | 6/2011 | Andersson |
| 2011/0156900 A1 | 6/2011 | Toda |
| 2011/0215736 A1 | 9/2011 | Horbst et al. |
| 2011/0227584 A1 | 9/2011 | Beck |
| 2011/0288658 A1 | 11/2011 | Walters et al. |
| 2012/0053888 A1 | 3/2012 | St hlin et al. |
| 2012/0062123 A1 | 3/2012 | Jarrell et al. |
| 2012/0086560 A1 | 4/2012 | Ilyes et al. |
| 2012/0086561 A1 | 4/2012 | Ilyes et al. |
| 2012/0126721 A1 | 5/2012 | Kuenzler et al. |
| 2012/0136485 A1 | 5/2012 | Weber et al. |
| 2012/0140748 A1 | 6/2012 | Carruthers |
| 2012/0154239 A1 | 6/2012 | Bar-Sade et al. |
| 2012/0163826 A1 | 6/2012 | Schenk et al. |
| 2012/0209505 A1 | 8/2012 | Breed et al. |
| 2012/0218101 A1 | 8/2012 | Ford |
| 2012/0230696 A1 | 9/2012 | Pederson et al. |
| 2012/0245880 A1 | 9/2012 | Nabrotzky |
| 2012/0256777 A1 | 10/2012 | Smith et al. |
| 2012/0262304 A1 | 10/2012 | Cripps |
| 2012/0280825 A1 | 11/2012 | Sakakihara |
| 2012/0286673 A1 | 11/2012 | Holland et al. |
| 2012/0299721 A1 | 11/2012 | Jones |
| 2012/0299755 A1 | 11/2012 | Jones |
| 2012/0308239 A1 | 12/2012 | Sheth et al. |
| 2012/0309293 A1 | 12/2012 | Kummetz et al. |
| 2012/0321321 A1 | 12/2012 | Riesebosch |
| 2012/0323474 A1 | 12/2012 | Breed et al. |
| 2013/0044488 A1 | 2/2013 | Hreish |
| 2013/0057158 A1 | 3/2013 | Josefowicz et al. |
| 2013/0063281 A1* | 3/2013 | Malaska .......... G08G 1/096783 340/905 |
| 2013/0076523 A1 | 3/2013 | Kwan et al. |
| 2013/0101003 A1 | 4/2013 | Vedantham et al. |
| 2013/0140995 A1 | 6/2013 | Jones |
| 2013/0144490 A1 | 6/2013 | Lord et al. |
| 2013/0169468 A1 | 7/2013 | Johnson et al. |
| 2013/0172012 A1 | 7/2013 | Zudrell-Koch |
| 2013/0181636 A1 | 7/2013 | Agrawal |
| 2013/0214697 A1 | 8/2013 | Archenhold |
| 2013/0221858 A1 | 8/2013 | Silberstein |
| 2013/0229116 A1 | 9/2013 | Van Zeijl et al. |
| 2013/0257284 A1 | 10/2013 | VanWagoner et al. |
| 2013/0293117 A1 | 11/2013 | Verfuerth |
| 2013/0330172 A1 | 12/2013 | Scipio et al. |
| 2013/0346229 A1 | 12/2013 | Martin et al. |
| 2014/0055439 A1 | 2/2014 | Lee et al. |
| 2014/0085055 A1 | 3/2014 | Lee et al. |
| 2014/0124007 A1 | 5/2014 | Scipio et al. |
| 2014/0125250 A1 | 5/2014 | Wilbur |
| 2014/0175982 A1 | 6/2014 | Yao et al. |
| 2014/0191858 A1 | 7/2014 | Morgan et al. |
| 2015/0023668 A1 | 1/2015 | Spaulding et al. |
| 2015/0173159 A1 | 6/2015 | Lin et al. |
| 2015/0319825 A1 | 11/2015 | Destine et al. |
| 2016/0094088 A1 | 3/2016 | Bjorn et al. |
| 2016/0095182 A1 | 3/2016 | Bjorn et al. |

FOREIGN PATENT DOCUMENTS

| | | | |
|---|---|---|---|
| EP | 2521426 A1 | 11/2012 | |
| GB | 2403357 A | 12/2004 | |
| JP | 05205193 | * | 8/1993 |
| JP | 2005248607 A | 9/2005 | |
| JP | 2009025209 A | 2/2009 | |
| JP | 2009103497 A | 5/2009 | |
| KR | 1020060008967 A | 1/2006 | |
| KR | 1020060102552 A | 9/2006 | |
| KR | 100986279 B1 | 10/2010 | |
| WO | 2005029437 A2 | 3/2005 | |
| WO | 2009148466 A1 | 12/2009 | |
| WO | 2010079388 A1 | 7/2010 | |
| WO | 2011142516 A1 | 11/2011 | |
| WO | 2012090142 A2 | 7/2012 | |
| WO | 2012140152 A1 | 10/2012 | |
| WO | 2013160791 A2 | 10/2013 | |

OTHER PUBLICATIONS

Noe et al., "Global Positioning System, A Navigation Algorithm for the Low-Cost GPS Receiver", The Institute of Navigation, vol. No. 1, pp. 166-172, 1980.

Proakis, "Spread Spectrum Signals for Digital Communication," in Digital Communications, for an overview of DS theory, pp. 1-27, 1983.

Hershey et al., "Random and Pseudorandom Sequences," Data Transportation and Protection, pp. 259-310, 1986.

"Millimeter Wave Propagation: Spectrum Management Implications" published by the FCC as Bulletin No. 70, Jul. 1997.

Pang et al., "LED Traffic Light as a Communications Device", Proceedings of the International Conference on Intelligent Transportation Systems, pp. 788-793, 1999.

Mimbela et al., "A Summary of Vehicle Detection and Surveillance Technologies Used in Intelligent Transportation Systems", Southwest Technology Development Institute, pp. 1-211, Nov. 30, 2000.

Bullimore, "Controlling Traffic With Radio", IEEE Review, vol. No. 47, Issue No. 1, pp. 40-44, Jan. 2001.

Chao-Qun et al., "Application of Low-voltage Power Line Communication in a City Street Lamp Long-distance Intelligent Monitoring System", Research and Developments, 2006.

Cho et al., "Street Lighting Control Based On LonWorks Power Line Communication", Power Line Communications and its Applications, pp. 396-398, Apr. 2008.

Awan et al., "Characterization of Fog and Snow Attenuations for Free-Space Optical Propagation", Journal of Communications, vol. No. 4, Issue No. 8, pp. 533-545, Sep. 2009.

Rich, "Light Monitoring System Keeps Glendale, Ariz., Out of the Dark", Government Technology, Oct. 24, 2011.

"Monitoring and Evaluation Protocol for the Field Performance of LED Street Lighting Technologies", Light Savers Accelerating Advanced Outdoor Lighting, Prepared by Toronto Atmospheric Fund in Partnership with Ontario Municipal Street Lighting Focus Group and Ontario Power Authority, pp. 1-32, 2011.

Qian et. al., "Based on PLC and GPRS, ZigBee street lamp wireless control system", Electronic Design Engineering, vol. No. 20, Issue No. 3, Feb. 2012.

Stevens et al., "White Paper—The Benefits of 60 GHz Unlicensed Wireless Communications" as captured by Wayback machine, SUB10 systems.com, pp. 1-10, May 7, 2012.

"Wireless Control and Communication System for LED Luminaires and Other Devices", San Francisco Public Utilities Commission Power Enterprise, pp. 1-15, Jun. 7, 2012.

Zotos et al., "Case study of a dimmable outdoor lighting system with intelligent management and remote control", Telecommunications and Multimedia (TEMU), 2012 International Conference on, pp. 43-48, Jul. 30-Aug. 1, 2012.

Caillet et al., "LonMark, the open Smart Streetlight Platform", Lonmark International, pp. 1-16, Feb. 2013.

After Newtown: A new use for a weapons-detecting radar?, University of Michigan, Apr. 1, 2013.

Lee et al., "Distributed dimming control for LED lighting", Optics Express, vol. No. 21, Issue No. S6, pp. 1-16, Nov. 2013.

International Search Report and Written Opinion issued in connection with related PCT Application No. PCT/US2014/066954 dated Feb. 26, 2015.

(56) References Cited

OTHER PUBLICATIONS

International Search Report and Written Opinion issued in connection with related PCT Application No. PCT/US2014/066922 dated Feb. 26, 2015.
International Search Report and Written Opinion issued in connection with related PCT Application No. PCT/US2014/066957 dated Mar. 5, 2015.
International Search Report and Written Opinion issued in connection with corresponding PCT Application No. PCT/US2014/066917 dated Mar. 5, 2015.
International Search Report and Written Opinion issued in connection with related PCT Application No. PCT/US2014/066337 dated Mar. 6, 2015.
International Search Report and Written Opinion issued in connection with related PCT Application No. PCT/US2014/066948 dated Mar. 9, 2015.
International Search Report and Written Opinion issued in connection with related PCT Application No. PCT/US2014/066942 dated Mar. 20, 2015.
U.S. Appl. No. 14/543,892, filed Nov. 18, 2014, Hershey et al.
U.S. Appl. No. 14/546,954, filed Nov. 18, 2014, Hartman et al.
U.S. Appl. No. 14/546,408, filed Nov. 18, 2014, Hartman et al.
U.S. Appl. No. 14/484,300, filed Sep. 12, 2014, Hartman et al.
U.S. Appl. No. 14/546,486, filed Nov. 18, 2014, Hartman et al.
U.S. Appl. No. 14/546,916, filed Nov. 18, 2014, Hartman et al.
U.S. Appl. No. 14/546,256, filed Nov. 18, 2014, Barnett et al.
U.S. Appl. No. 14/546,856, filed Nov. 18, 2014, Hartman et al.
International Search Report and Written Opinion issued in connection with corresponding PCT Application No. PCT/US2014/066927 dated Feb. 27, 2015.
US Non-Final Office Action issued in connection with related U.S. Appl. No. 14/484,300 on Dec. 4, 2015.
US Non-Final Office Action issued in connection with related U.S. Appl. No. 14/546,256 on Dec. 30, 2015.
US Non-Final Office Action issued in connection with related U.S. Appl. No. 14/546,954 on Apr. 20, 2016.
US Non-Final Office Action issued in connection with related U.S. Appl. No. 14/543,892 on May 9, 2016.
US Non-Final Office Action issued in connection with related U.S. Appl. No. 14/546,916 on May 11, 2016.
Final Office Action issued in connection with related U.S. Appl. No. 14/546,256 on Jun. 2, 2016.
Notice of Allowance Office Action issued in connection with related U.S. Appl. No. 14/543,892 on Aug. 26, 2016.
Notice of Allowance Office Action issued in connection with related U.S. Appl. No.14/546,954 on Sep. 16, 2016.

\* cited by examiner

EMERGENCY VEHICLE ALERT SYSTEM

Fig. 5A  Fig. 5B vehicle motion towards traffic signal

EMERGENCY VEHICLE ALERT SYSTEM

CROSS REFERENCE TO RELATED APPLICATIONS

This application is a non-provisional of and claims the benefit of U.S. Provisional Patent Application Ser. Nos. 61/907,069, 61/907,078, 61/907,090, 61/907,114, 61/907,133, 61/907,150, 61/907,168, 61/907,188 and 61/907,210 filed on Nov. 21, 2013, the entire contents of which are incorporated herein by reference.

BACKGROUND

Traffic volume continues to increase in urban areas. This ever increasing volume of traffic continues to impede emergency vehicle transits in an already crowded city. One very important capability for emergency responders piloting a vehicle through a city is the ability to control a traffic light directly in their path. Many systems involving communications have been proposed to instantiate this capability but they are all subject to various problems including interference and the need for periodic maintenance of some of the vehicle electronics.

There is therefore a need for a system that is robust to interference, does not require periodic maintenance, such as the replacement of batteries, and does not require a significant effort on the part of the emergency responders to control the traffic lights, and is, majorly decentralized.

SUMMARY

A traffic light control system and method wherein a traffic signal is capable of generating and transmitting a signal within a frequency band of 57-64 GHz and a receiver capable of receiving a response to the signal. A computational device is contained within the traffic signal that is communicatively coupled to the receiver to provide processing capabilities that analyze the response to the signal to determine if a specified condition is present.

BRIEF DESCRIPTION OF THE ILLUSTRATIONS

DETAILED DESCRIPTION

A suitable electromagnetic spectrum for use in the US for enabling the emergency vehicle alert system has been made available by the spectrum allocation of 57-64 GHz for unlicensed operation. This very large contiguous portion of the electromagnetic spectrum has excellent attributes for enabling an emergency vehicle to control a traffic control system. In an embodiment, a passive transponder carried by the emergency vehicle is enabled to reflect signals within the available spectrum allocation of 57-64 GHz back to the source of the signals indicating that an emergency vehicle is in the vicinity. The source may be a traffic signal that is a self-contained localized traffic control system. The system does not necessarily need to rely on a centralized traffic control infrastructure; however, systems that coordinate the local traffic control systems with centralized traffic control systems are envisioned.

Figure 1:
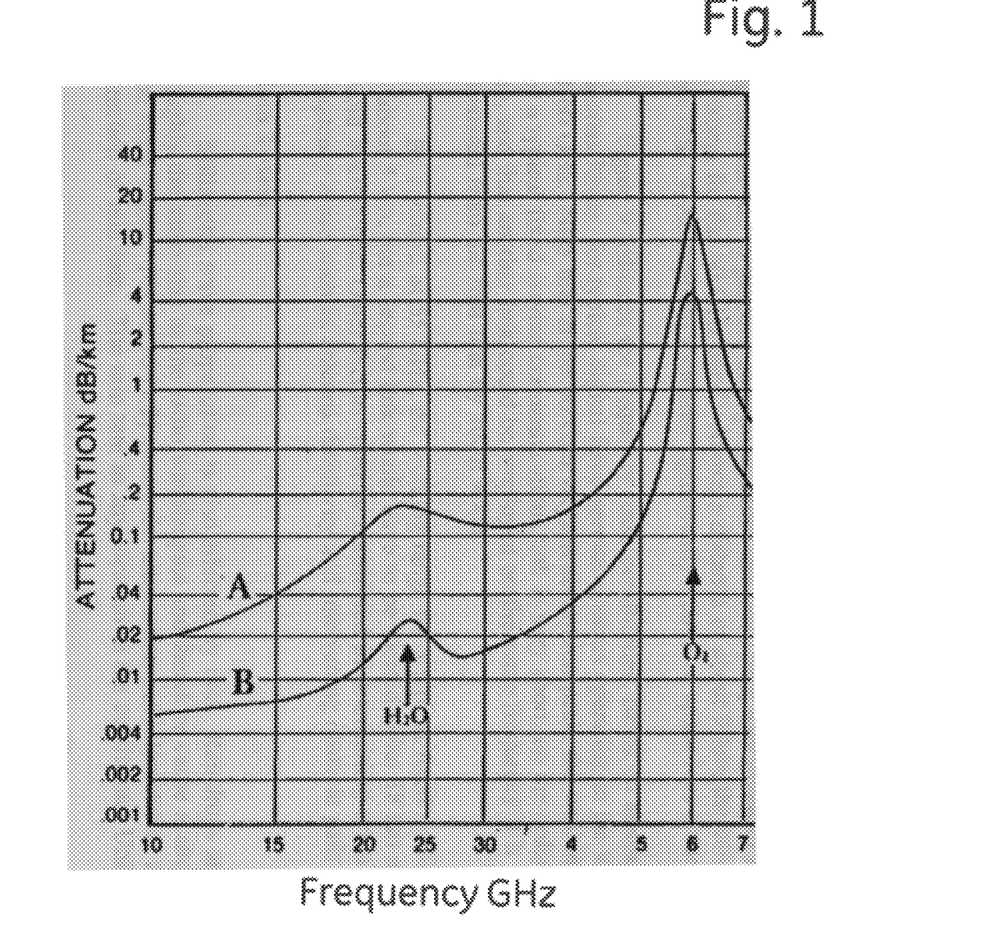
FIG. 1 is a graph of millimeter wave atmospheric attenuation.
Figure 2:
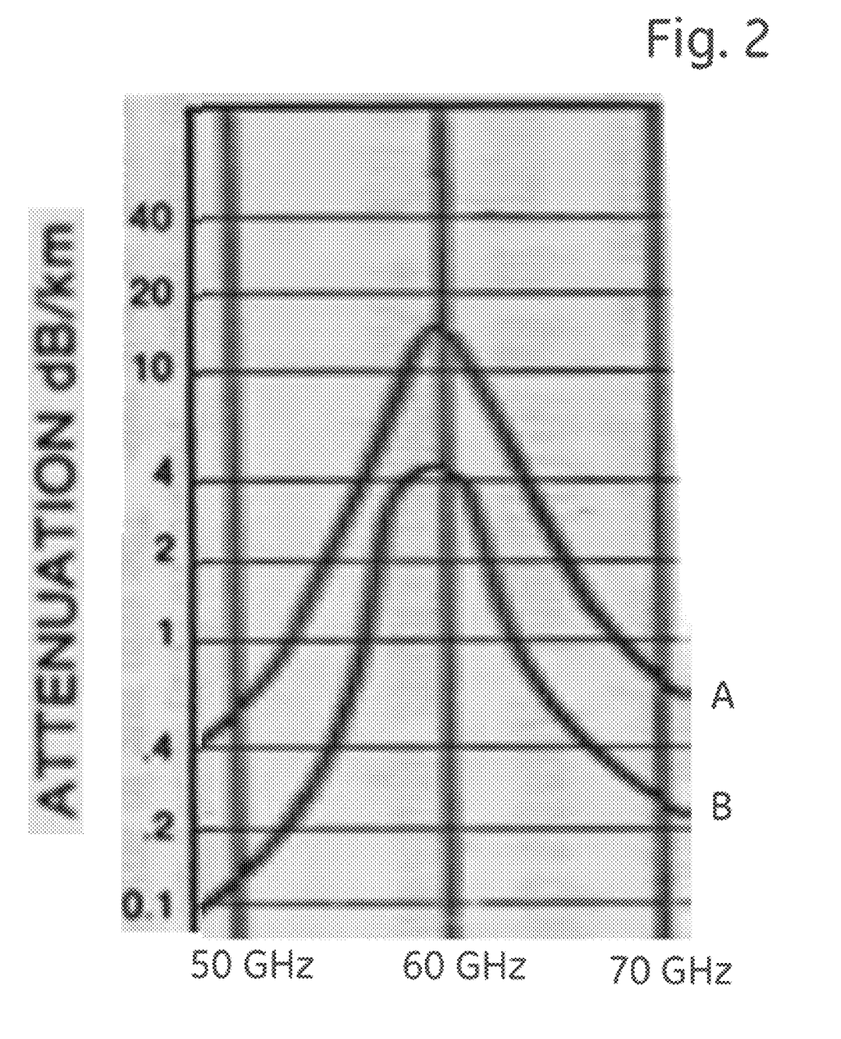
FIG. 2 is a portion of the graph of FIG. 1.

FIG. 1 is taken from "Millimeter Wave Propagation: Spectrum Management Implications" published by the FCC as Bulletin Number 70, July, 1997. The figure shows the remarkable attenuation of electromagnetic energy in the atmosphere. Curve A is for sea level with temperature at 20° C., pressure at 760 mm, and water content at 7.5 gm/cubic meter (75% humidity); curve B is for an altitude of 4 km above sea level with temperature at 0° C. and water content at 1 gm/cubic meter (relatively dry air). FIG. 2 is an extract of FIG. 1 emphasizing a frequency range comprising the unlicensed spectrum and showing the frequency selective attenuation due primarily to oxygen.

As seen in FIGS. 1 and 2, there is relatively a high attenuation that occurs with distance for the millimeter wave frequency spectrum of 57-64 GHz. This high attenuation can work towards reducing interference from other sources, limit the number of potentially interfering transponders and provide clutter rejection. The amount of bandwidth available within the spectrum allocation of 57-64 GHz for the system to use is 7 GHz wide, a significant amount of spectrum. There are very many modulation and protocol schemes for performing transponding activity.

The passive transponder taught herein may be a device that may mounted on the top of the emergency vehicle. The passive transponder may include of a pair of corner reflectors, spaced apart by a distance D and oriented to maximize the radar cross section for millimeter wave RF signals incident upon the corner reflectors. In an embodiment, the orientations of the reflectors is designed to reflect millimeter wave RF signal incident from the direction in which the emergency vehicle is proceeding.

Figure 3:
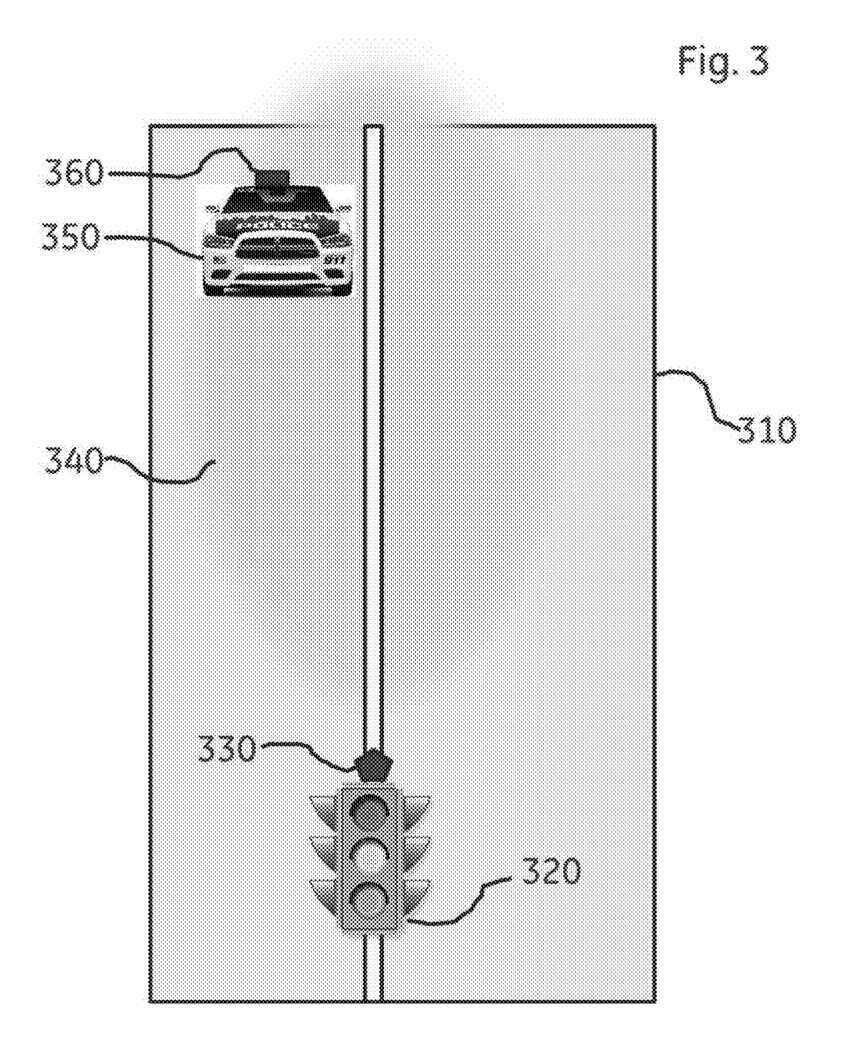
FIG. 3 illustrates the transponding scenario according to one embodiment.

FIG. 3 diagrams an example scenario. A police car 350 is proceeding on a street 310 towards a traffic signal 320. The traffic signal 320 has an antenna 330 capable of transmitting interrogation signals and receiving reflected portions of those interrogation signals. The antenna 330 may be mounted on top of the traffic signal 320 and is operatively connected to transmitter and receiver apparatus that is contained within the traffic signal 320. The antenna 330 may be configured to interrogate a device by transmission of an interrogation signal within the spectrum allocation of 57-64 GHz that may be received by a targeted device. The targeted device that receives the interrogation signal may respond to the reception in one of many ways in accordance with varying embodiments. In an embodiment, the targeted device may be a passive transponder 360. FIG. 3 shown a police car 350 with a passive transponder 360 mounted on top of the police car 350. The passive transponder 360 is enabled by traffic signal 320 sending an interrogation signal that is reflected by the passive transponder 360. Portion of the reflected interrogation signal is received by the traffic signal 302. Computational elements within the traffic signal 320 can perform signal processing on the received portions of the reflected interrogation signal. The antenna pattern interrogation signal transmitted by the traffic signal 320 is represented as the shaded area 340.

The passive transponder 360 mounted atop the police car may include a pair of erected corner reflectors separated by a distance D. Therefore, the reflector further towards the back of the police car 350 will receive the same interrogation signal received by the reflector towards the front of the police car 350 but delayed by D/c, where c is the speed of light.

As an example, and not by way of limitation, the interrogation signal transmitted by the traffic signal 320 may be a simple bi-phase coded, direct sequence (DS), spread spectrum signal. A common technique is to build a periodic, spread spectrum signal, where s(t) denotes one period of the periodic, spread spectrum signal. The periodic spread spectrum signal is formed by selecting a segment T-time units long of a sine wave of many periods that is multiplied by a sequence of chips, which are plus and minus ones.

In an embodiment, the sequence of chips within the interrogation signal may be chosen to have an autocorrelation characterized by a sharp spike around the zero-offset point of the autocorrelation and low magnitude sidelobes. The specific sequence of chips will be detectable by processing performed by a computational device contained within the traffic signal 320. The processing may detect the autocorrelation spikes within the reflected portions of the interrogation signal by cross-correlating the interrogation signal against the received signal which is the reflected portions of the interrogation signal.

In another embodiment, the sequence of chips within the interrogation signal may be chosen to have a low maximum absolute value of cross-correlation with other DS signals operating in the 57-64 GHz spectrum in order to avoid significant interference to and from the other DS signals operating in the 57-64 GHz spectrum.

In another embodiment, the interrogation signal has sequence of plus and minus ones of the chips and the segment of the sine wave of many periods aligned so that transition times of the sequence of plus and minus ones align with zero crossings of the segment of T-time unit is long of the sine wave of many periods. The interrogation signal formed for this example is built by concatenating one or more periods of s(t).

Figure 4:
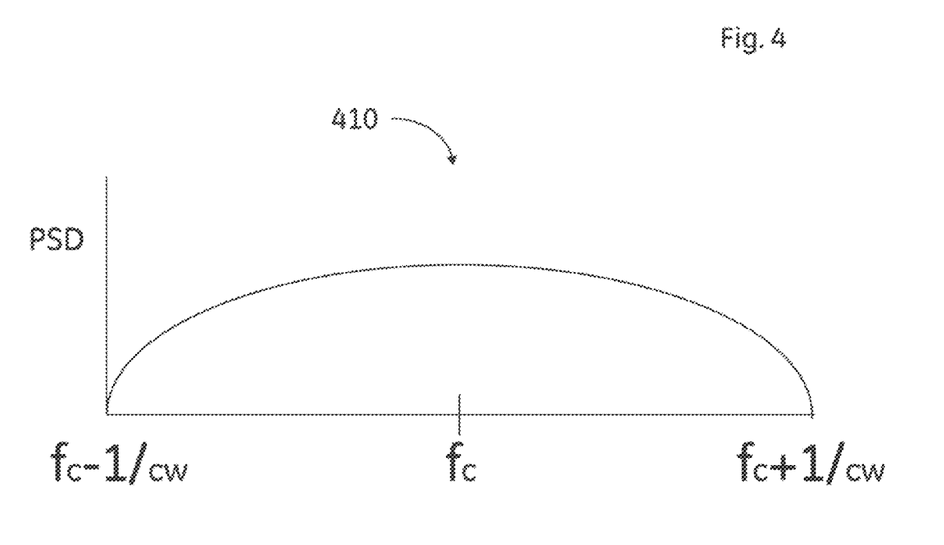
FIG. 4 illustrates the power spectral density of a DS spread spectrum signal.

FIG. 4 sketches the power spectral density 410 of the main lobe of the periodic spread spectrum signal with chip width cw. The main lobe is symmetric about the center frequency $f_c$, and spans the frequency range $f_c-_{cw}^{1}$ to $f_c+_{cw}^{1}$. The main lobe comprises about 90% of the signal's power. For example, a chip rate of 3.5 gigachips per second with center frequency at 60.5 GHz spreads the signal's main lobe across the entire unlicensed band. The spreading chips, a deterministic but pseudorandom sequence of binary values, will spread the signal energy approximately uniformly over the main lobe. At a signaling rate of 3.5 gigachips per second, there are 11.667 chips per meter. If D, for example, is chosen to be 0.3 meters, then the reflection from the reflector towards the back of the police car will be 7 chips delayed from the reflection from the reflector towards the front of the police car.

In an embodiment, the receiver associated with the traffic signal 320 may be operatively coupled to a computational device within the traffic signal 320 that continuously cross-correlates a period of the interrogation signal against the received signal and stacks the processed returns. The stacking forms an average of the cross-correlations by periodically summing their successive overlays and results in noise mitigation of the cross-correlation so that two cross-correlation spikes, spaced by 7 chip times, will rise out of the clutter and noise. The cross-correlation spikes signify the presence of a transponding emergency vehicle in the vicinity allowing computational elements within the traffic light to set a state of a transponding emergency vehicle. In an embodiment, the state of a transponding emergency vehicle may cause the traffic light to enter an emergency mode. In an embodiment, the emergency mode may be simply turning traffic signals in every direction to red.

In an embodiment, computational elements may perform system processing to estimate the emergency vehicle's position, direction and/or speed. Embodiments are envisioned wherein emergency the emergency vehicle's location, speed and direction are recorded and/or reported to a central control system.

To better overcome clutter and increase the probability of detection while decreasing the probability of a false alarm, an embodiment may use circularly polarized transmissions having circularly polarized antennas with low axial-ratios. In an embodiment, the corner reflectors are specifically dimensioned. An appropriate model for the corner reflector's role is through a radar formulation. The maximum radar cross section (RCS), σ, of a triangular corner reflector, with common edge length L, is $$\sigma = \frac{4\pi L^4}{3 \cdot \lambda^2}$$

where λ is the wavelength.

In an embodiment, if an emergency responder, such as a police officer in a police car, wishes to enable the passive transponder and thereby enable the emergency vehicle to respond to a traffic light's interrogation and enter its emergency mode, the emergency responder may manually enable the passive transponder. This may be done in many ways. In one embodiment, an emergency responder releases a mechanical latch that causes the reflectors to erect so that they reflect electromagnetic energy arriving at the vehicle's front.

Figure 5A:
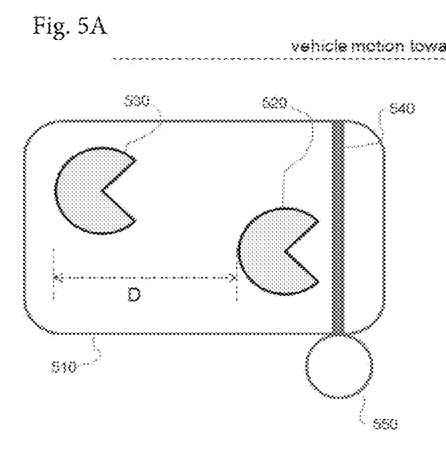
FIG. 5a and FIG. 5b illustrate an embodiment of the passive transponder.
Figure 5B:
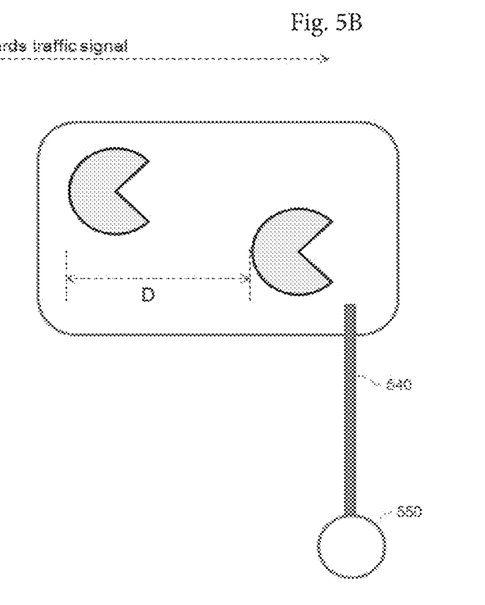

In another embodiment the emergency responder pulls down a ring that is attached to a metallic plate as illustrated in FIGS. 5A and 5B.

In embodiments shown by these illustrations the passive transponder is located in an electromagnetically transparent housing 510 that affords the passive transponder some shelter from the elements such as winds and rain. A pair of substantially identical corner reflectors 520 and 530 is mounted so that their centers are separated by distance D along a line oriented towards the traffic light's interrogator.

In an embodiment, the corner reflectors may be positioned so that the rear reflector, the reflector furthest from the front of the policed car, is not significantly shadowed by the other reflector. In FIGS. 5A and 5B, the rear reflector is located at a higher position than the other reflector.

In an embodiment, a piece of RF millimeter wave opaque material 540 is located in front and across the aperture of the corner reflector 520. When the material 540 is so located, there will be no significant reflection from corner reflector 520. To enable the passive transponder, the piece of material 540 is pulled out of the way by pulling on an attached ring 550.

In another embodiment, the passive transponder may be activated by a motorized mechanical means.

Other embodiments may provide for a more automated activations of transponders in emergency vehicles. For example in one embodiment, the occurrence of an event, such as the siren being used or blinking lights being activated, may in turn activate the transponder. In another embodiment, the transponder may be activated by a mechanism such as a switch inside the emergency vehicle.

While only certain features of the invention have been illustrated and described herein, many modifications and changes will occur to those skilled in the art. It is, therefore, to be understood that the appended claims are intended to cover all such modifications and changes as fall within the true spirit of the invention.

In another embodiment, some systems will handle and haul communications for other infrastructure systems. These messages may require a higher standard of care ensuring delivery or notification of non-delivery. When the streetlight optical signaling network is handling these messages, it may invoke a packet-handling protocol with strict accountability for assuring delivery and initiating retransmissions as required.

An exemplary technical effect of the methods and systems described herein includes: (a) generating a melt pool based on the build parameters of the component; (b) detecting an optical signal generated by the melt pool to measure the size or the temperature of the melt pool; and (c) modifying the build parameters in real-time based on the size or the temperature of the melt pool to achieve a desired physical property of the component.

Some embodiments involve the use of one or more electronic or computing devices. Such devices typically include a processor or controller, such as, without limitation, a general purpose central processing unit (CPU), a graphics processing unit (GPU), a microcontroller, a field programmable gate array (FPGA), a reduced instruction set computer (RISC) processor, an application specific integrated circuit (ASIC), a programmable logic circuit (PLC), and/or any other circuit or processor capable of executing the functions described herein.

The methods described herein may be encoded as executable instructions embodied in a computer readable medium, including, without limitation, a storage device, and/or a memory device. Such instructions, when executed by a processor, cause the processor to perform at least a portion of the methods described herein. The above examples are exemplary only, and thus are not intended to limit in any way the definition and/or meaning of the term processor.

Exemplary embodiments for enhancing the build parameters for making additive manufactured components are described above in detail. The apparatus, systems, and methods are not limited to the specific embodiments described herein, but rather, operations of the methods and components of the systems may be utilized independently and separately from other operations or components described herein. For example, the systems, methods, and apparatus described herein may have other industrial or consumer applications and are not limited to practice with electronic components as described herein. Rather, one or more embodiments may be implemented and utilized in connection with other industries.

Although specific features of various embodiments of the invention may be shown in some drawings and not in others, this is for convenience only. In accordance with the principles of the invention, any feature of a drawing may be referenced or claimed in combination with any feature of any other drawing.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A traffic light control system comprising:
at least one traffic signal apparatus;
a signal generator, contained within the traffic signal apparatus, that generates a signal within a frequency band of 57-64 GHz;
a transmitter, contained within the traffic signal apparatus, that transmits the signal;
a receiver, contained within the traffic signal apparatus, that receives a response to the signal; and
a computational device, contained within the traffic signal apparatus, communicatively coupled to the receiver that analyzes the response to the signal to determine if a specified condition is present,
wherein the specified condition is a sequence of plus and minus ones within reflected portions of the signal and a segment within the signal having a sine wave of many periods is aligned so that transition times of the sequence of plus and minus ones align with zero crossings of the sine wave within the segment.

2. The traffic light control system of claim 1 wherein the computational device sets an emergency mode for the traffic signal if the specified condition is present.

3. The traffic light control system of claim 1 wherein the signal generator generates a direct sequence spread spectrum signal with a main lobe that occupies a majority of the 57-64 GHz band.

4. The system of claim 1 wherein the response received is a reflection of the transmitted signal.

5. The traffic light control system of claim 4 further comprising a pair of erected reflectors separated by a distance D, said pair of erected reflectors generating the reflection.

6. The traffic light control system of claim 5 wherein the computational device processes the reflection by continuously cross-correlating the transmitted signal against the received response and stacking the cross-correlations.

7. The traffic light control system of claim 6 wherein the specified condition is the presence of two spikes in the stacked cross-correlations wherein the spikes are separated in time by twice the distance D divided by the speed of light.

8. The traffic light control system of claim 1 wherein the specified condition is a sharp spike around a zero-offset point of an autocorrelation and low magnitude sidelobes.

9. The traffic light control system of claim 1 wherein the response is generated by an emergency vehicle in response to the emergency vehicle receiving the signal.

10. A method for traffic light control comprising:
equipping at least one traffic signal with a signal generator;
generating a signal within a frequency band of 57-64 GHz;
transmitting the signal;
receiving a response to the signal;
further equipping the at least one traffic signal with a computational device for processing the received response;
processing the response to determine if a specified condition is present; and
controlling the at least one traffic signal on determining the presence of the specified condition,
wherein processing further comprises determining if the specified condition is met within the reflection, wherein the specified condition is a sequence of plus and minus ones within reflected portions of the signal and a segment within the signal having a sine wave of many periods is aligned so that transition times of the sequence of plus and minus ones align with zero crossings of the sine wave within the segment.

11. The method of claim 10 wherein generating the signal within a frequency band of 57-64 GHz further comprises generating a direct sequence spread spectrum signal with a main lobe occupying a majority of the 57-64 GHz band.

12. The method of claim 10 wherein controlling further comprises setting an emergency mode for the traffic signal if the processing of the response determines the presence of the specified condition.

13. The method of claim 10 wherein receiving the response further comprises receiving a reflection of the transmitted signal.

14. The method of claim 13 further comprising erecting a pair of reflectors on an emergency vehicle wherein the reflectors are separated by a distance D, said pair of reflectors generating the reflection.

15. The method of claim 14 wherein processing further comprises processing the reflection by the computational device to continuously cross-correlate the transmitted signal against the received response and stacking cross-correlations.

16. The method of claim 15 wherein processing further comprises determining the presence of the specified condition by revealing the presence of two spikes in stacked crosscorrelations wherein the spikes are separated in time by twice the distance D divided by the speed of light.

17. The method of claim 10 wherein processing further comprises processing the reflection to continuously decorrelate and incoherently stack processed returns of the reflection to identify correlation spikes spaced by a predetermined number of chip times.

18. The method of claim 10 wherein the response is generated by an emergency vehicle in response to the emergency vehicle receiving the signal.

* * * * *